US009164145B2

(12) United States Patent
Seo et al.

(10) Patent No.: US 9,164,145 B2
(45) Date of Patent: Oct. 20, 2015

(54) APPARATUS AND METHOD FOR TESTING SEMICONDUCTOR DEVICE

(71) Applicant: SAMSUNG ELECTRO-MECHANICS CO., LTD., Suwon, Gyunggi-do (KR)

(72) Inventors: Shang Hoon Seo, Gyunggi-do (KR); Seung Hwan Kim, Gyunggi-do (KR); Suk Jin Ham, Gyunggi-do (KR)

(73) Assignee: SAMSUNG ELECTRO-MECHANICS CO., LTD., Suwon-Si, Gyeonggi-Do (KR)

( * ) Notice: Subject to any disclaimer, the term of this patent is extended or adjusted under 35 U.S.C. 154(b) by 175 days.

(21) Appl. No.: 13/750,882

(22) Filed: Jan. 25, 2013

(65) Prior Publication Data

US 2014/0133100 A1 May 15, 2014

(30) Foreign Application Priority Data

Nov. 15, 2012 (KR) .................. 10-2012-0129380

(51) Int. Cl.
*G01R 31/28* (2006.01)
(52) U.S. Cl.
CPC .................................. *G01R 31/2874* (2013.01)
(58) Field of Classification Search
USPC ............ 324/750.03, 750.05, 750.06, 750.07, 324/750.08, 750.09, 322, 685, 719, 750, 324/750.04, 750.28, 762.03; 700/300, 299; 219/494, 444.1
See application file for complete search history.

(56) References Cited

U.S. PATENT DOCUMENTS

| 6,184,504 | B1* | 2/2001 | Cardella .................. 219/513 |
| 6,593,761 | B1* | 7/2003 | Fukasawa et al. ........ 324/750.13 |
| 7,008,804 | B2* | 3/2006 | Song et al. ................ 438/14 |
| 8,653,824 | B1* | 2/2014 | Liu et al. ................ 324/750.03 |
| 2002/0033391 | A1* | 3/2002 | Malinoski et al. .......... 219/494 |
| 2006/0290370 | A1* | 12/2006 | Lopez .......................... 324/765 |
| 2007/0041425 | A1* | 2/2007 | Lee et al. ................... 374/208 |
| 2009/0102499 | A1* | 4/2009 | Segawa et al. ................ 324/760 |
| 2010/0013543 | A1* | 1/2010 | Kang ............................ 327/512 |
| 2013/0094302 | A1* | 4/2013 | Do ............................ 365/189.05 |

FOREIGN PATENT DOCUMENTS

| JP | 2001-051012 A | 2/2001 |
| KR | 2007-0025255 A | 3/2007 |
| KR | 2010-0109218 A | 10/2010 |

* cited by examiner

*Primary Examiner* — Melissa Koval
*Assistant Examiner* — Nasima Monsur
(74) *Attorney, Agent, or Firm* — McDermott Will & Emery LLP

(57) ABSTRACT

There are provided an apparatus for testing a semiconductor device and a method for testing a semiconductor device. The apparatus for testing a semiconductor device includes: a temperature detection unit detecting a temperature of a semiconductor device to generate a detected temperature; a controller comparing the detected temperature with a preset control temperature to generate a comparison result, and determining whether to cool the semiconductor device according to the comparison result; and a cooling unit cooling the semiconductor device according to a control of the controller, wherein the controller resets the control temperature, when the detected temperature is outside of a range of an operational temperature of the semiconductor device.

15 Claims, 4 Drawing Sheets

APPARATUS AND METHOD FOR TESTING SEMICONDUCTOR DEVICE

CROSS-REFERENCE TO RELATED APPLICATIONS

This application claims the priority of Korean Patent Application No. 10-2012-0129380 filed on Nov. 15, 2012, in the Korean Intellectual Property Office, the disclosure of which is incorporated herein by reference.

BACKGROUND OF THE INVENTION

1. Field of the Invention

The present invention relates to an apparatus for testing a semiconductor device and a method for testing a semiconductor device.

2. Description of the Related Art

Semiconductor devices are commonly screened to remove those having initial defects. Currently, typical screening methods include a method based on voltage acceleration and a method based on temperature acceleration.

When semiconductor devices having a high heating value are screened, even though screening is performed at the same voltage and temperature, individual semiconductor devices have differences in heating values due to fabrication variations, or the like, thereof. Due to the differences in heating values of semiconductor devices, a temperature of a semiconductor device may be outside of a regulated temperature control range.

Patent document 1, among related art documents mentioned below, proposes a semiconductor testing system capable of maintaining an IC device at a predetermined temperature by controlling a temperature of a contact block in which the IC device is housed. In detail, a temperature control technique of installing a cavity in the contact block in which the IC device is housed, and selectively jetting a high temperature control liquid and a low temperature control liquid from a high temperature control nozzle or a low temperature control nozzle installed in the cavity to the contact block according to a gas temperature of the IC device has been proposed.

However, a method for removing temperature variations generated in testing operations of semiconductor devices has yet to be disclosed.

RELATED ART DOCUMENT (Patent document 1) Japanese Patent Laid-Open Publication No. 2001-51012

SUMMARY OF THE INVENTION

An aspect of the present invention provides an apparatus for testing a semiconductor device and a method for testing a semiconductor device capable of removing temperature variations generated in testing operations of semiconductor devices by changing a reference temperature for cooling semiconductor devices according to measured temperatures of the semiconductor devices.

According to an aspect of the present invention, there is provided an apparatus for testing a semiconductor device, the apparatus including: a temperature detection unit detecting a temperature of a semiconductor device to generate a detected temperature; a controller comparing the detected temperature with a preset control temperature to generate a comparison result, and determining whether to cool the semiconductor device according to the comparison result; and a cooling unit cooling the semiconductor device according to a control of the controller, wherein the controller resets the control temperature, when the detected temperature is outside of a range of an operational temperature of the semiconductor device.

The control temperature may include a first control temperature and a second control temperature, and the controller may control the cooling unit to start the cooling of the semiconductor device at a point in time at which the detected temperature is equal to or higher than the first control temperature and stop the cooling of the semiconductor device at a point in time at which the detected temperature is equal to or lower than the second control temperature.

The controller may reset the first control temperature and the second control temperature according to the detected temperature and the operational temperature.

The operational temperature may include a first operational temperature as a highest operational temperature at which the semiconductor device is operable and a second operational temperature as a lowest operational temperature at which the semiconductor device is operable The controller may reset the first control temperature by comparing the first operational temperature with a highest measured temperature in a rising section in which the detected temperature rises and reset the second control temperature by comparing the second operational temperature with a lowest measured temperature in a falling section in which the detected temperature falls.

The controller may reset the first control temperature in an (M+1)th rising section by comparing the first operational temperature with a highest measured temperature in an Mth rising section in which the detected temperature rises, and reset the second control temperature in an (N+1)th falling section by comparing the second operational temperature with a lowest measured temperature in an Nth falling section in which the detected temperature falls, wherein the M and the N are integers equal to or greater than 1.

The controller may satisfy conditional expression 1 regarding the first control temperature in the (M+1)th rising section and satisfy conditional expression 2 regarding the second control temperature in the (N+1)th falling section.

$$Th_{M+1} = Th_M + w1*(T_{o1} - T_{M\_max})$$ [Conditional expression 1]

wherein $Th_M$ is the first control temperature in an Mth rising section, w1 is a first weight, $T_{o1}$ is the first operational temperature, and $T_{M\_max}$ is a highest measured temperature in the Mth rising section.

$$Tl_{N+1} = Tl_N + w2*(T_{o2} - T_{N\_min})$$ [Conditional expression 2]

wherein $Tl_N$ is the second control temperature in an Nth falling section, w2 is a second weight, $T_{o2}$ is the second operational temperature, and $T_N*\_min$ is a lowest measured temperature in the Nth falling section.

The apparatus may further include a testing board on which the semiconductor device is mounted.

The semiconductor device may be provided in plural, and the plurality of semiconductor devices may be mounted on the testing board.

The controller may compare detected temperatures of the plurality of semiconductor devices with the control temperature, and control the cooling unit to cool the plurality of semiconductor devices, respectively.

According to another aspect of the present invention, there is provided a method for testing a semiconductor device, including: detecting a temperature of a semiconductor device; comparing the detected temperature of the semiconductor device with a preset control temperature, and cooling the semiconductor device; and resetting the control temperature when the detected temperature is outside of a range of an operational temperature of the semiconductor device.

The control temperature may include a first control temperature and a second control temperature, and in the cooling of the semiconductor device, the cooling of the semiconductor device may be started at a point in time at which the detected temperature is equal to or higher than the first control temperature and stopped at a point in time at which the detected temperature is equal to or lower than the second control temperature.

In the resetting of the control temperature, the first control temperature and the second control temperature may be reset according to the detected temperature and the operational temperature.

The operational temperature may include a first operational temperature as a highest operational temperature at which the semiconductor device is operable and a second operational temperature as a lowest operational temperature at which the semiconductor device is operable.

In the resetting of the control temperature, the first control temperature may be reset by comparing the first operational temperature with a highest measured temperature in a rising section in which the detected temperature rises, and the second control temperature may be reset by comparing the second operational temperature with a lowest measured temperature in a falling section in which the detected temperature falls.

In the resetting of the control temperature, the first control temperature in an (M+1)th rising section may be reset by comparing the first operational temperature with a highest measured temperature in an Mth rising section in which the detected temperature rises, and the second control temperature in an (N+1)th falling section may be reset by comparing the second operational temperature with a lowest measured temperature in an Nth falling section in which the detected temperature falls, wherein the M and the N are integers equal to or greater than 1.

In the resetting of the control temperature, conditional expression 1 may be satisfied regarding the first control temperature in the (M+1)th rising section and conditional expression 2 may be satisfied regarding the second control temperature in the (N+1)th falling section.

$$Th_{M+1} = Th_M + w1*(T_{o1} - T_{M\_max})$$ [Conditional expression 1]

Wherein $Th_x$ is the first control temperature in an Xth rising section, w1 is a first weight, $T_{o1}$ is the first operational temperature, and $T_{x\_max}$ is a highest measured temperature in the Xth rising section.

$$Tl_{N+1} = Tl_N + w2*(T_{o2} - T_{N\_min})$$ [Conditional expression 2]

Wherein $Tl_x$ is the second control temperature in an Xth falling section, w2 is a second weight, $T_{o2}$ is the second operational temperature, and $T_{x\_min}$ is a lowest measured temperature in the Xth falling section.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
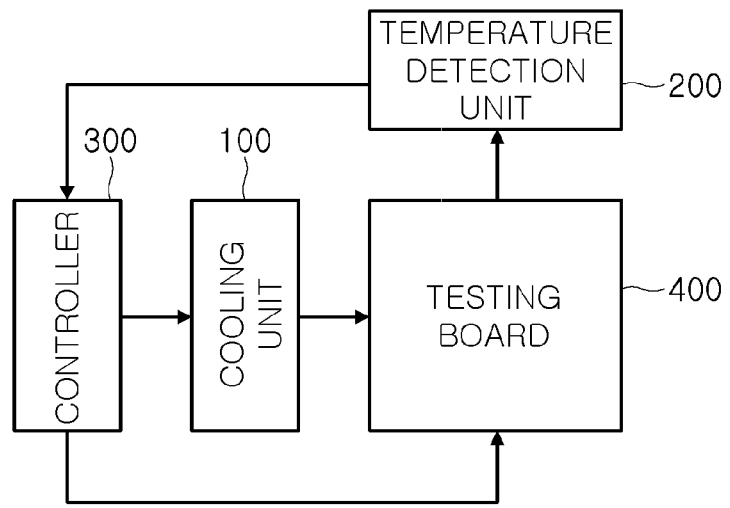
FIG. 1 is a block diagram of an apparatus for testing a semiconductor device according to an embodiment of the present invention.

Hereinafter, embodiments of the present invention will be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions of elements may be exaggerated for clarity, and the same reference numerals will be used throughout to designate the same or like elements.

FIG. 1 is a block diagram of an apparatus for testing a semiconductor device according to an embodiment of the present invention.

Referring to FIG. 1, the apparatus for testing a semiconductor device according to an embodiment of the present invention may include a temperature detection unit 200, a cooling unit 100, a controller 300, and a testing board 400.

The temperature detection unit 200 may detect a temperature according to heating of a semiconductor device to generate a detected temperature.

The cooling unit 100 may cool the semiconductor device under the control of the controller 300. The cooling unit 100 may include a cooling fan, but the present invention is not limited thereto and the semiconductor device may be cooled by using a solution flowing in a pipe.

The controller 300 may transfer a signal for testing an operation of the semiconductor device to the semiconductor device through the testing board 400. Also, the controller 300 may control the cooling unit 100 by comparing the detected temperature transferred from the temperature detection unit 200 with a preset control temperature.

The control temperature is a temperature previously set to determine a point in time at which the semiconductor device starts to be cooled and a point in time at which cooling of the semiconductor device is stopped. The control temperature may include a first control temperature for determining a point in time at which the semiconductor device is started to be cooled and a second control temperature for determining a point in time at which cooling of the semiconductor device is stopped.

When the detected temperature is outside of the range of an operational temperature of the semiconductor device, the controller 300 may reset the control temperature. The operational temperature is a preset temperature at which the semiconductor device operates. The operational temperature may have a predetermined range having an upper limit and a lower limit. In detail, the operational temperature may include a first operational temperature as the highest temperature for the semiconductor device to operate and a second operational temperature as the lowest temperature for the semiconductor device to operate.

The testing board 400 refers to a board on which the semiconductor device is mounted. The testing board 400 may be electrically connected to the controller 300 to perform testing and the controller 300 may transfer a signal for testing an operation of the semiconductor device through the testing board 400. In FIG. 1, only a single testing board 400 is illustrated, but a plurality of testing boards 400 may be selectively provided.

Figure 2:
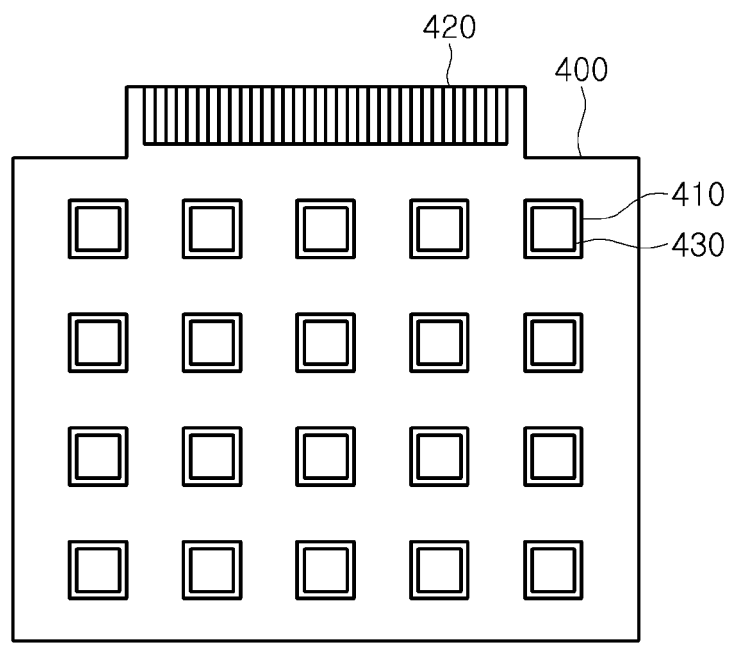
FIG. 2 is a view illustrating an example of a testing board as an element of the present invention.

FIG. 2 is a view illustrating an example of the testing board 400 as an element of the present invention. A plurality of IC sockets 410 are mounted on the testing board 400, and a semiconductor device 430 as a testing target is installed on each IC socket 410. Also, the testing board 400 has a terminal group 420 electrically connected to the IC socket 410 through a wiring (not shown). The semiconductor device 430 installed on the IC socket 410 of the testing board 400 receives a signal for testing an operation from the controller 300 through the wiring and the terminal group 420.

When a plurality of semiconductor devices 430 are mounted on the plurality of IC sockets 410, the controller 300 may compare detected temperatures of the plurality of semiconductor devices 430 with a control temperature, and control the cooling unit 100 to cool the plurality of semiconductor devices 430, respectively.

Also, in FIG. 2, a case in which the IC sockets 410 are disposed in a matrix form having four rows and five columns is illustrated as an example, but the present invention is not limited thereto. A disposition method of the IC sockets 410 and the number of disposed IC sockets 410 may be arbitrarily changed in the testing board 400.

Figure 3:
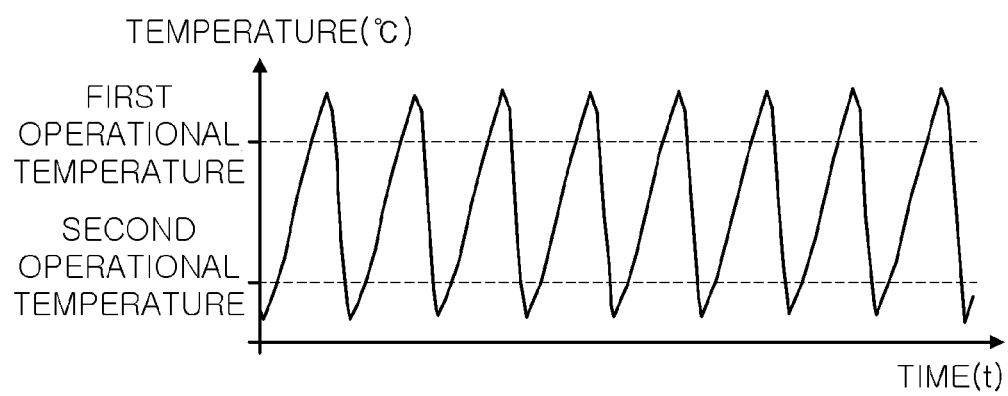
FIG. 3 is a temperature graph of a semiconductor device when an operation of the semiconductor device is tested by an apparatus for testing a semiconductor device according to the related art.

FIG. 3 is a temperature graph of a semiconductor device when an operation of the semiconductor device is tested by an apparatus for testing a semiconductor device according to the related art. Referring to FIG. 3, it can be seen that a temperature curve is changed outside of an internal range of a first operational temperature and a second operational temperature.

In case that the apparatus for testing a semiconductor device tests a semiconductor device, when a temperature of the semiconductor device rises to reach the first operational temperature, the cooling unit 100 starts to cool the semiconductor device, and the cooling unit 100 stops the cooling of the semiconductor device when the temperature of the semiconductor device falls to reach the second operational temperature according to the cooling of the semiconductor device by the cooling unit 100.

In this case, however, when the cooling unit 100 is, for example, a cooling fan, a predetermined period of time is required for the cooling fan to reach maximum RPM, and a predetermined period of time is required for the cooling fan to be completely stopped after reaching maximum RPM. Also, when the cooling unit 100 is, for example, a solution flowing through a pipe, a predetermined period of time is required for the solution to completely flow out of the pipe.

Namely, it can be seen that, after the detected temperature of the semiconductor device reaches the first operational temperature or the second operational temperature, a delay time exists to a point in time at which cooling is completely started or to a point in time at which cooling is completely stopped.

Due to the delay time, as illustrated in FIG. 3, an overshooting phenomenon occurs as the temperature curve is changed outside of the internal range of the first operational temperature and the second operational temperature.

Figure 4:
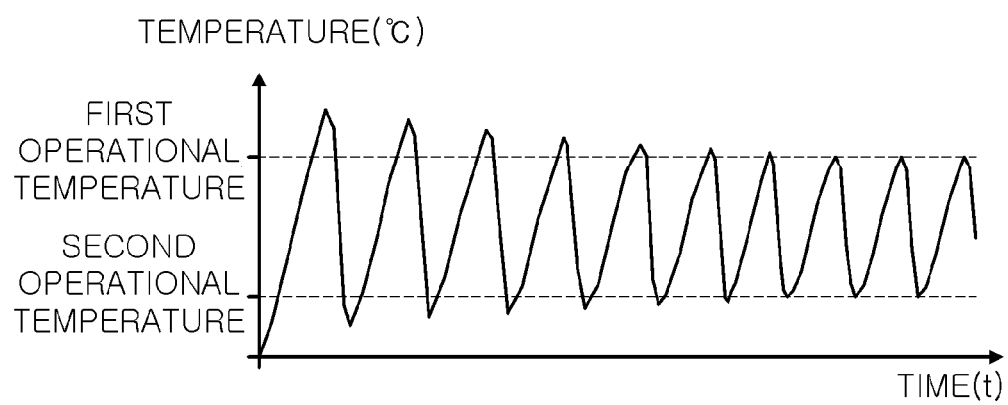
FIG. 4 is a temperature graph of a semiconductor device when an operation of the semiconductor device is tested by an apparatus for testing a semiconductor device according to an embodiment of the present invention.

FIG. 4 is a temperature graph of a semiconductor device when an operation of the semiconductor device is tested by an apparatus for testing a semiconductor device according to an embodiment of the present invention.

Referring to FIG. 4, it can be seen that, the temperature curve operates outside of the range of the first operational temperature and the second operational temperature at an initial stage of testing the operation of the semiconductor device, but as time passes, the change in the temperature curve is converged with the first operational temperature and the second operational temperature, eliminating the overshooting phenomenon.

In an embodiment of the present invention, the foregoing overshooting phenomenon is eliminated by using a closed loop control method and it will be described in detail hereinafter.

Figure 5:
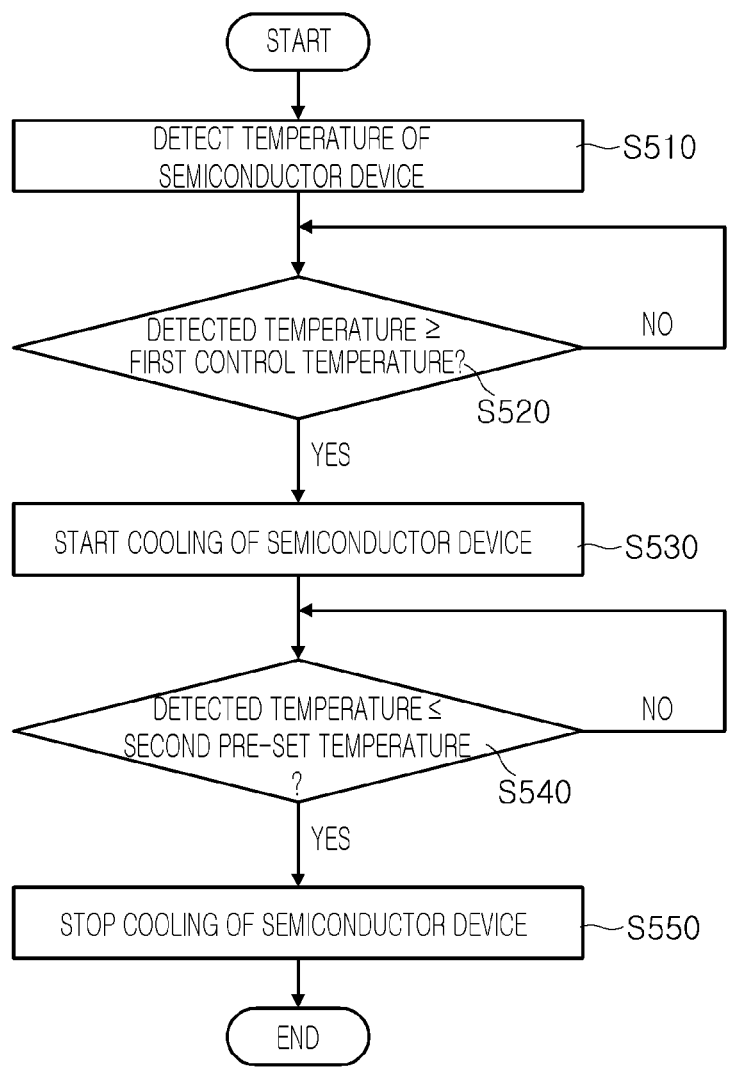
FIG. 5 is a flow chart illustrating a method for cooling a semiconductor device by the apparatus for testing a semiconductor device according to an embodiment of the present invention.

FIG. 5 is a flowchart illustrating a method for cooling a semiconductor device by the apparatus for testing a semiconductor device according to an embodiment of the present invention. A method for cooling a semiconductor device by the apparatus for testing a semiconductor device according to an embodiment of the present invention will be described. It is assumed that the semiconductor device is not cooled at an initial stage.

The temperature detection unit 200 may detect a temperature of the semiconductor device to generate a detected temperature (S510). The temperature detection unit 200 may detect a temperature of the semiconductor device and transfer the detected temperature to the controller 300 continuously or according to a preset period.

Upon receiving the detected temperature from the temperature detection unit 200, the controller 300 compares the detected temperature with a control temperature, and control the cooling unit 100 to cool the semiconductor device according to the comparison result.

In detail, the controller 300 may compare the detected temperature with a first control temperature (S520). Since the semiconductor device has not been cooled at an initial stage, a temperature of the semiconductor device may be gradually increased by heat generated according to the operation testing. When the detected temperature is lower than the first control temperature, the controller 300 may determine whether the detected temperature reaches the first control temperature by repeatedly comparing the detected temperature with the first control temperature.

The controller 300 may control the cooling unit 100 to start cooling of the semiconductor device at a point in time at which the detected temperature reaches the first control temperature or is equal to or higher than the first control temperature (S530).

After cooling is started, the controller 300 compares the detected temperature with a second control temperature (S540). When the detected temperature exceeds the second control temperature, the controller 300 determines whether the detected temperature reaches the second control temperature by repeatedly comparing the detected temperature with the second control temperature.

The controller 300 may control the cooling unit 100 to stop the cooling of the semiconductor device at a point in time at which the detected temperature reaches the second control temperature or is equal to or lower than the second control temperature (S550).

Although not shown in FIG. 5, steps S510 and S550 may be repeatedly performed.

Figure 6:
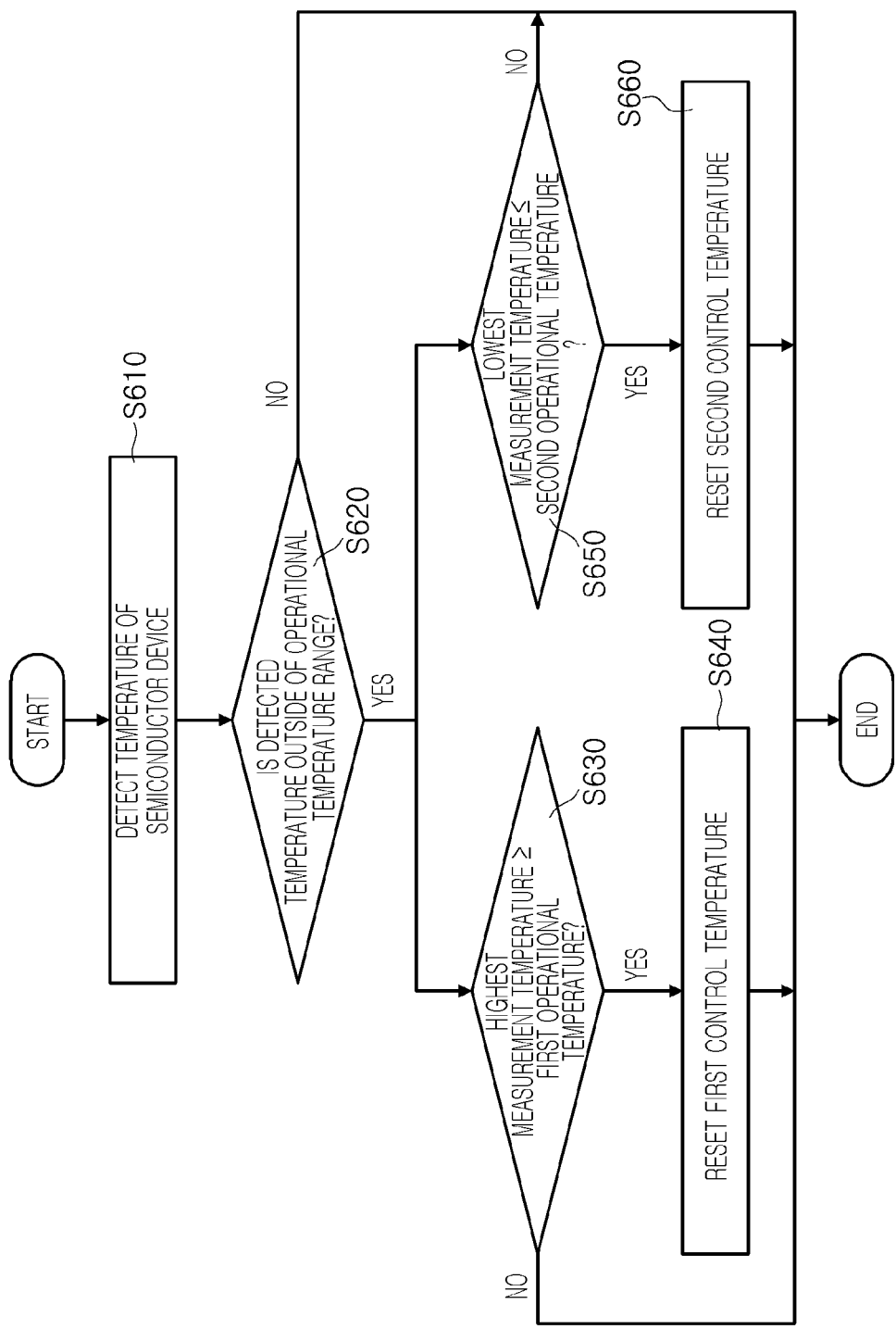
FIG. 6 is a flow chart illustrating a method for resetting a control temperature by the apparatus for testing a semiconductor device according to an embodiment of the present invention.

FIG. 6 is a flow chart illustrating a method for resetting a control temperature by the apparatus for testing a semiconductor device according to an embodiment of the present invention. The method for setting a control temperature by the apparatus for testing a semiconductor device according to an embodiment of the present invention will be described with reference to FIGS. 1 and 6.

The temperature detection unit 200 may detect a temperature of the semiconductor device to generate a detected temperature (S610). The temperature detection unit 200 may detect a temperature of the semiconductor device and transfer the detected temperature to the controller 300 continuously or according to a preset period.

Upon receiving the detected temperature from the temperature detection unit 200, the controller 300 compares the detected temperature with an operational temperature, and resets a control temperature according to the comparison result. The control temperature may be initially set to be equal to an operational temperature for the semiconductor device to operate.

In detail, the controller 300 may compare the detected temperature with an operational temperature for the semiconductor device to operate (S620).

When the detected temperature is within the range of an operational temperature, the controller 300 may determine that the semiconductor device is appropriately cooled by the control temperature initially set to be equal to the operational temperature, and perform termination without resetting the control temperature.

However, when the detected temperature is outside of the range of the operational temperature, the controller 300 may compare the highest measured temperature in a rising section in which the detected temperature rises with a first operational temperature (S630). When the highest measured temperature is lower than the first operational temperature, the controller 300 may determine that the first control temperature is not required to be reset.

However, when the highest measured temperature is equal to or higher than the first operational temperature, the controller 300 may determine that the first control temperature is required to be reset. In detail, when the highest measured temperature in an Mth rising section in which the detected temperature rises is equal to or higher than the first operational temperature, the controller 300 may reset the first control temperature in an (M+1)th rising section (S640). Here, M may be an integer equal to or greater than 1.

Here, the first control temperature in the (M+1)th rising section may satisfy Conditional expression 1.

$$Th_{M+1} = Th_M + w1*(T_{o1} - T_{M\_max})$$ [Conditional expression 1]

Here, $Th_x$ is the first control temperature in an Xth rising section, w1 is a first weight, $T_{o1}$ is the first operational temperature, and $T_{x\_max}$ is a highest measured temperature in the Xth rising section.

The first weight is a certain value greater than 0 and smaller than 1, which may be changed by a setting.

Also, when the detected temperature is outside of the range of the operational temperature, the lowest measured temperature in a falling section in which the detected temperature falls and a second operational temperature may be compared (S650). When the lowest measured temperature is higher than the second operational temperature, the controller 300 may determine that the second control temperature is not required to be reset.

However, when the lowest measured temperature is equal to or lower than the second operational temperature, the controller 300 may determine that the second control temperature is required to be reset. In detail, when the lowest measured temperature in an Nth rising section in which the detected temperature rises is equal to or lower than the second operational temperature, the controller 300 may reset the second control temperature in an (N+1)th rising section (S660). Here, N may be an integer equal to or greater than 1.

Here, the second control temperature in the (N+1)th rising section may satisfy Conditional expression 2.

$$Tl_{N+1} = Tl_N + w2*(T_{o2} - T_{N\_min})$$ [Conditional expression 2]

Here, $Tl_x$ is the second control temperature in an Xth falling section, w2 is a second weight, $T_{o2}$ is the second operational temperature, and $T_{x\_min}$ is a lowest measured temperature in the Xth falling section.

The second weight is a certain value greater than 0 and smaller than 1, which may be changed by a setting. Also, the second weight and the first weight may be set as the same value or may be set as different values.

As set forth above, according to embodiments of the invention, by changing a reference temperature for cooling a semiconductor device according to a measured temperature of the semiconductor device, temperature variations generated in testing operations of the semiconductor device can be eliminated.

While the present invention has been shown and described in connection with the embodiments, it will be apparent to those skilled in the art that modifications and variations can be made without departing from the spirit and scope of the invention as defined by the appended claims.

What is claimed is:

1. An apparatus for testing a semiconductor device, the apparatus comprising:
    a temperature detection unit detecting a temperature of a semiconductor device to generate a detected temperature;
    a controller comparing the detected temperature with a preset control temperature to generate a comparison result, and determining whether to cool the semiconductor device according to the comparison result; and
    a cooling unit cooling the semiconductor device according to a control of the controller,
    wherein the controller resets the control temperature, when the detected temperature is outside of a range of an operational temperature of the semiconductor device,
    wherein the control temperature includes a first control temperature and a second control temperature, and
    wherein the controller resets the first control temperature and the second control temperature according to the detected temperature and the operational temperature.

2. The apparatus of claim 1, wherein
the controller controls the cooling unit to start the cooling of the semiconductor device at a point in time at which the detected temperature is equal to or higher than the first control temperature and stop the cooling of the semiconductor device at a point in time at which the detected temperature is equal to or lower than the second control temperature.

3. The apparatus of claim 1, wherein the operational temperature includes a first operational temperature as a highest operational temperature at which the semiconductor device is operable and a second operational temperature as a lowest operational temperature at which the semiconductor device is operable.

4. The apparatus of claim 3, wherein the controller resets the first control temperature by comparing the first operational temperature with a highest measured temperature in a rising section in which the detected temperature rises, and resets the second control temperature by comparing the second operational temperature with a lowest measured temperature in a falling section in which the detected temperature falls.

5. The apparatus of claim 3, wherein the controller resets the first control temperature in an (M+1)th rising section by comparing the first operational temperature with a highest measured temperature in an Mth rising section in which the detected temperature rises, and resets the second control temperature in an (N+1)th falling section by comparing the second operational temperature with a lowest measured temperature in an Nth falling section in which the detected temperature falls, wherein the M and the N are integers equal to or greater than 1.

6. The apparatus of claim 5, wherein the controller satisfies conditional expression 1 regarding the first control temperature in the (M+1)th rising section and satisfies conditional expression 2 regarding the second control temperature in the (N+1)th falling section:

$$Th_{M+1} = Th_M + w1*(T_{01} - T_{M\_max})$$  [Conditional expression 1]

wherein $Th_M$ is the first control temperature in an Mth rising section, w1 is a first weight, $T_{01}$ is the first operational temperature, and $T_M$max is a highest measured temperature in the Mth rising section:

$$Tl_{N+1} = Tl_N + w2*(T_{02} - T_{N\_min})$$  [Conditional expression 2]

wherein $Tl_N$ is the second control temperature in an Nth falling section, w2 is a second weight, $T_{02}$ is the second operational temperature, and $T_N$ min is a lowest measured temperature in the Nth falling section.

7. The apparatus of claim 1, further comprising a testing board on which the semiconductor device is mounted.

8. The apparatus of claim 7, wherein the semiconductor device may be provided in plural, and the plurality of semiconductor devices are mounted on the testing board.

9. The apparatus of claim 8, wherein the controller compares detected temperatures of the plurality of semiconductor devices with the control temperature, and controls the cooling unit to cool the plurality of semiconductor devices, respectively.

10. A method for testing a semiconductor device, the method comprising:
    detecting a temperature of a semiconductor device;
    comparing the detected temperature of the semiconductor device with a preset control temperature, and cooling the semiconductor device; and
    resetting the control temperature when the detected temperature is outside of a range of an operational temperature of the semiconductor device,
    wherein the control temperature includes a first control temperature and a second control temperature, and
    wherein in the resetting of the control temperature, the first control temperature and the second control temperature are reset according to the detected temperature and the operational temperature.

11. The method of claim 10, wherein
    in the cooling of the semiconductor device, the cooling of the semiconductor device is started at a point in time at which the detected temperature is equal to or higher than the first control temperature and stopped at a point in time at which the detected temperature is equal to or lower than the second control temperature.

12. The method of claim 10, wherein the operational temperature includes a first operational temperature as a highest operational temperature at which the semiconductor device is operable and a second operational temperature as a lowest operational temperature at which the semiconductor device is operable.

13. The method of claim 12, wherein in the resetting of the control temperature,
    the first control temperature is reset by comparing the first operational temperature with a highest measured temperature in a rising section in which the detected temperature rises, and the second control temperature is reset by comparing the second operational temperature with a lowest measured temperature in a falling section in which the detected temperature falls.

14. method of claim 13, wherein in the resetting of the control temperature,
    the first control temperature in an (M+1)th rising section is reset by comparing the first operational temperature with a highest measured temperature in an Mth rising section in which the detected temperature rises, and
    the second control temperature in an (N+1)th falling section is reset by comparing the second operational temperature with a lowest measured temperature in an Nth falling section in which the detected temperature falls,
    wherein the M and the N are integers equal to or greater than 1.

15. The method of claim 14, wherein in the resetting of the control temperature,
    conditional expression 1 is satisfied regarding the first control temperature in the (M+1)th rising section and conditional expression 2 is satisfied regarding the second control temperature in the (N+1)th falling section:

$$Th_{M+1} = Th_M + w1*(T_{01} - T_{M\_max})$$  [Conditional expression 1]

wherein $Th_M$ is the first control temperature in an Mth rising section, w1 is a first weight, $T_{01}$ is the first operational temperature, and $T_M$ max is a highest measured temperature in the Mth rising section:

$$Tl_{N+1} = Tl_N + w2*(T_{02} - T_{N\_min})$$  [Conditional expression 2]

wherein $Tl_N$ is the second control temperature in an Nth falling section, w2 is a second weight, $T_{02}$ is the second operational temperature, and $T_N$ min is a lowest measured temperature in the Nth falling section.

* * * * *